(12) United States Patent
Uebbing

(10) Patent No.: US 6,658,041 B2
(45) Date of Patent: Dec. 2, 2003

(54) WAFER BONDED VERTICAL CAVITY SURFACE EMITTING LASER SYSTEMS

(75) Inventor: John J. Uebbing, Palo Alto, CA (US)

(73) Assignee: Agilent Technologies, Inc., Palo Alto, CA (US)

(*) Notice: Subject to any disclaimer, the term of this patent is extended or adjusted under 35 U.S.C. 154(b) by 0 days.

(21) Appl. No.: 10/102,294

(22) Filed: Mar. 20, 2002

(65) Prior Publication Data
US 2003/0179800 A1 Sep. 25, 2003

(51) Int. Cl.[7] .................................................. H01S 3/08
(52) U.S. Cl. .......................................... 372/96; 372/50
(58) Field of Search .......................... 372/96; 359/180; 438/47, 289; 257/98

(56) References Cited

U.S. PATENT DOCUMENTS

| | | |
|---|---|---|
| 3,959,045 A | 5/1976 | Antypas |
| 4,400,868 A | 8/1983 | Antypas et al. |
| 5,309,468 A * | 5/1994 | Makiuchi ..................... 372/50 |
| 5,502,316 A | 3/1996 | Kish et al. |
| 5,821,571 A | 10/1998 | Lebby et al. |
| 5,835,521 A | 11/1998 | Ramdani et al. |
| 5,837,561 A * | 11/1998 | Kish et al. ................... 438/47 |
| 6,277,696 B1 * | 8/2001 | Carey et al. ................ 438/289 |
| 6,320,206 B1 | 11/2001 | Coman et al. |
| 6,339,496 B1 * | 1/2002 | Koley et al. ................. 359/344 |
| 6,466,349 B1 * | 10/2002 | Valley et al. ................ 359/180 |
| 2002/0071464 A1 * | 6/2002 | Coldren et al. ............... 372/45 |
| 2002/0075926 A1 * | 6/2002 | Coldren et al. ............... 372/46 |
| 2002/0090016 A1 * | 7/2002 | Coldren et al. ............... 372/96 |
| 2002/0093024 A1 * | 7/2002 | Lee et al. ...................... 257/98 |

FOREIGN PATENT DOCUMENTS

KR         61983      * 9/2000 .................... 257/59

* cited by examiner

Primary Examiner—Paul Ip
Assistant Examiner—Hung T Vy

(57) ABSTRACT

Vertical cavity surface emitting laser systems and methods of making the same are described. In one aspect, a vertical cavity surface emitting laser system has a bottom side that may be flip-chip mounted to a driver substrate and a top side that is configured to transmit light through an optically transparent substrate. By this configuration, vertical cavity surface emitting laser systems may be packed together with a greater density and operated at greater speeds relative to, for example, wire bonded vertical cavity surface emitting laser systems. In addition, such systems may be flexibly tailored to produce light over a wide range of wavelengths. Such systems also may be efficiently packaged on a wafer scale.

22 Claims, 3 Drawing Sheets

WAFER BONDED VERTICAL CAVITY SURFACE EMITTING LASER SYSTEMS

TECHNICAL FIELD

This invention relates to wafer bonded vertical cavity surface emitting laser (VCSEL) systems and methods of making the same.

BACKGROUND

A VCSEL is a laser device formed from an optically active semiconductor layer (e.g., AlInGaAs or InGaAsP) that is sandwiched between a pair of highly reflective mirror stacks, which may be formed from layers of metallic material, dielectric material or epitaxially-grown semiconductor material. Typically, one of the mirror stacks is made less reflective than the other so that a portion of the coherent light that builds in a resonating cavity formed in the optically active semiconductor layer between the mirror stacks may be emitted from the device. Typically, a VCSEL emits laser light from the top or bottom surface of the resonating cavity with a relatively small beam divergence. VCSELs may be arranged in singlets, one-dimensional or two-dimensional arrays, tested on wafer, and incorporated easily into an optical transceiver module that may be coupled to a fiber optic cable.

In general, a wafer bonding technique may be characterized as a direct wafer bonding technique or a metallic wafer bonding technique. In direct wafer bonding, two wafers are fused together by mass transport at a bonding interface. Direct wafer bonding may be performed between any combination of semiconductor, oxide, and dielectric materials. Direct wafer bonding typically is performed at high temperature and under uniaxial pressure. In metallic wafer bonding, two substrates are bonded together by a metallic layer that is melted and re-solidified at a bonding interface.

Wafer bonding techniques have been used in the fabrication of optoelectronic devices. For example, U.S. Pat. No. 6,320,206 has proposed a scheme for forming optical devices having aluminum gallium indium nitride active layers and high quality mirror stacks that are wafer bonded on one or both sides of the active layers. U.S. Pat. No. 5,837,561 describes a vertical cavity surface emitting laser that is wafer bonded to a transparent substrate. A top circular metal contact is disposed on the transparent substrate and a second metal contact is disposed over the bottom mirror of the vertical cavity surface emitting laser. The transparent substrate serves as an escape medium for laser emission through the top circular metal contact. This configuration allows the heat producing active layer of the vertical cavity surface emitting laser to be mounted near a heat sink, thereby improving the performance of the device.

SUMMARY

The invention features vertical cavity surface emitting laser systems and methods of making the same. In particular, the invention features a vertical cavity surface emitting laser system having a bottom side that may be flip-chip mounted to a driver substrate and a top side configured to transmit light through an optically transparent substrate. By this configuration, the invention enables vertical cavity surface emitting laser systems to be packed together with a greater density and operated at greater speeds relative to, for example, wire bonded vertical cavity surface emitting laser systems. In addition, such systems may be flexibly tailored to produce light over a wide range of wavelengths. Such systems also may be efficiently packaged on a wafer scale.

In one aspect, the invention features a vertical cavity surface emitting laser (VCSEL) system, comprising a substrate, a vertical stack structure, and a pair of contacts. The substrate is optically transparent to light in a selected wavelength range. The vertical stack structure has a substantially planar top side, which is wafer bonded to the optically transparent substrate, and a bottom side. The vertical stack structure includes a top mirror, a bottom mirror, and a cavity region that is disposed between the top mirror and the bottom mirror and includes an active light generation region that is operable to generate light in the selected wavelength range. The vertical stack structure is constructed and arranged to direct light generated in the cavity region to the optically transparent substrate. First and second contacts are disposed over the bottom side of the vertical stack structure and are electrically connected for driving the cavity region.

Embodiments in accordance with this aspect of the invention may include one or more of the following features.

In some embodiments, the optically transparent substrate comprises glass (e.g., borosilicate glass). In other embodiments, the optically transparent substrate comprises gallium phosphide.

The VCSEL system may further comprise a lens that is disposed on the glass substrate in alignment with the active light generation region.

In some embodiments, at least one of the top mirror and the bottom mirror has a layer with a peripheral region that is oxidized into an electrical insulator as a result of exposure to an oxidizing agent. In these embodiments, the VCSEL system may further comprise two or more etched holes each extending from a substantially planar surface of the bottom mirror to the oxidized peripheral region.

The top mirror and the bottom mirror preferably each comprises a system of alternating layers of different refractive index materials. For example, the top mirror and the bottom mirror each may comprise a system of alternating layers of relatively high aluminum content AlGaAs and relatively low aluminum content AlGaAs.

In some embodiments, the VCSEL system further comprises an integrated circuit that is bonded to the pair of contacts and is operable to drive the cavity region.

In another aspect, the invention features a method of fabricating the above described VCSEL system. In accordance with this inventive method, a sacrificial substrate is provided. A vertical stack structure having a substantially planar top side and a bottom side is formed over the vertical stack structure. The vertical stack structure includes a top mirror, a bottom mirror, and a cavity region that is disposed between the top mirror and the bottom mirror and includes an active light generation region operable to generate light in a selected wavelength range. The vertical stack structure is constructed and arranged to direct light generated in the cavity region away from the sacrificial substrate. The substantially planar top side of the vertical stack structure is wafer bonded to a substrate that is optically transparent to light in the selected wavelength range. The sacrificial substrate is removed after the optically transparent substrate has been wafer bonded to the substantially planar top side of the vertical stack structure. First and second contacts that are electrically connected for driving the cavity region are formed over the bottom side of the vertical stack structure.

Other features and advantages of the invention will become apparent from the following description, including the drawings and the claims.

DETAILED DESCRIPTION

In the following description, like reference numbers are used to identify like elements. Furthermore, the drawings are intended to illustrate major features of exemplary embodiments in a diagrammatic manner. The drawings are not intended to depict every feature of actual embodiments nor relative dimensions of the depicted elements, and are not drawn to scale.

Figure 1:
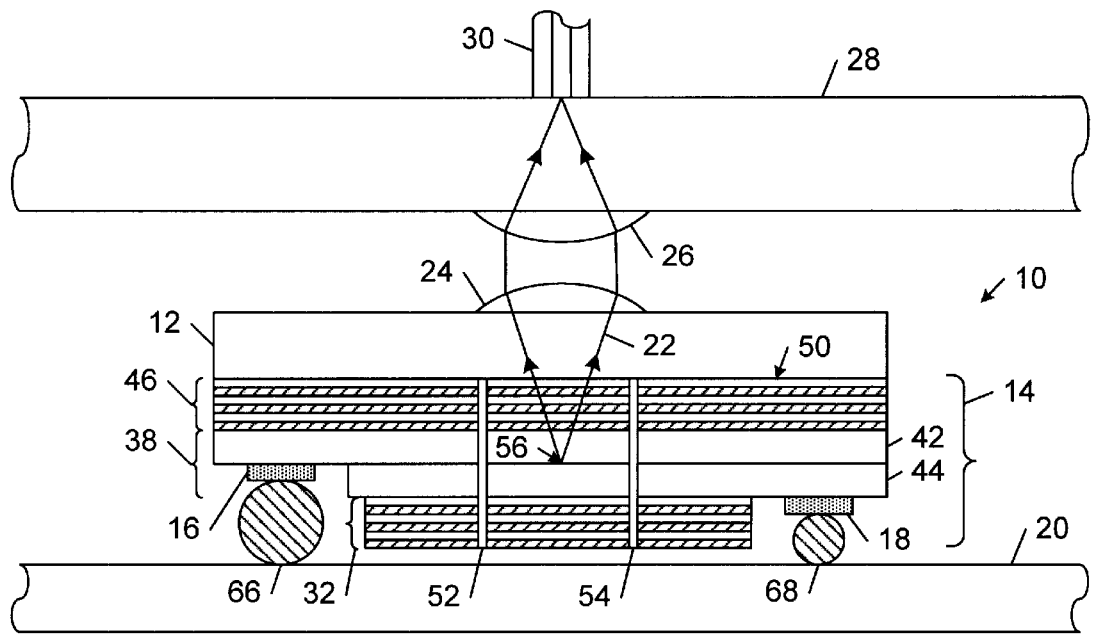
FIG. 1 is a diagrammatic cross-sectional side view of a vertical cavity surface emitting laser system that is flip chip mounted to a driver substrate and an optical fiber positioned on an opposite side of a package window to receive light generated by the vertical cavity surface emitting laser system.

Referring to FIG. 1, in one embodiment, a vertical cavity surface emitting laser system 10 includes an optically transparent substrate 12, a vertical stack structure 14, and a pair of contacts 16, 18 that are flip chip bonded to a driver substrate 20. In operation, a driving circuit disposed on driver substrate 20 applies a current between contacts 16, 18 that drives vertical stack structure 14 to generate light 22 in a selected wavelength range. Light 22 passes through optically transparent substrate 12 and is collimated by a first lens 24 that is disposed on optically transparent substrate 12. A second lens 26, which is disposed on an optically transparent package window 28, focuses the collimated light 22 received from first lens 24 into an optical fiber 30.

Figure 2:
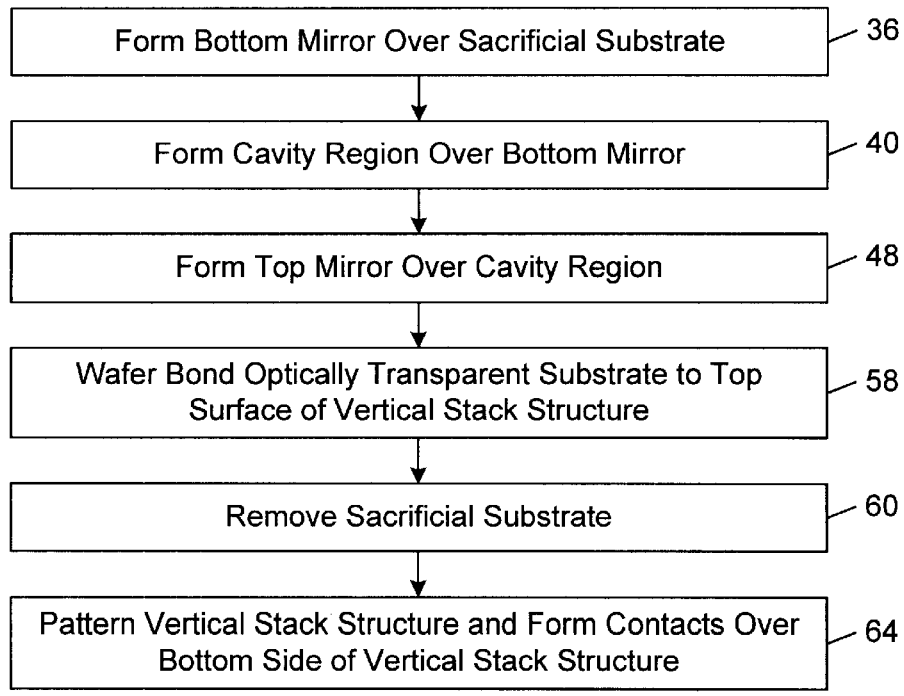
FIG. 2 is a flow diagram of a method of making the vertical cavity surface emitting laser system of FIG. 1.
Figure 3A:
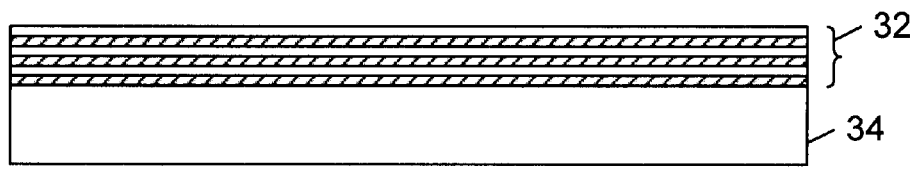
FIG. 3A is a diagrammatic cross-sectional side view of a bottom mirror formed over a sacrificial substrate.

Referring to FIGS. 2 and 3A–3F, and initially to FIGS. 2 and 3A, vertical cavity surface emitting laser system 10 may be fabricated as follows.

Initially, a bottom mirror stack 32 is formed on a sacrificial substrate 34 (step 36; FIG. 2). Bottom mirror stack 32 includes a system of alternating layers of different refractive index materials that forms a distributed Bragg reflector (DBR) that is designed for a desired operating laser wavelength (e.g., a wavelength in the range of 650 nm to 1650 nm). For example, bottom mirror stack 32 may be formed, of alternating layers of high aluminum content AlGaAs and low aluminum content AlGaAs. The layers of bottom mirror stack 32 preferably have an effective optical thickness (i.e., the layer thickness multiplied by the refractive index of the layer) that is about one-quarter of the operating laser wavelength. Sacrificial substrate 34 preferably is formed from a material that is lattice-matched to the layers of bottom mirror stack 32. For example, sacrificial substrate 34 may be formed from GaAs, InP, sapphire ($Al_2O_3$), or InGaAs and may be undoped, doped n-type (e.g., with Si) or doped p-type (e.g., with Zn). A buffer layer (not shown) may be grown on sacrificial substrate 34 before bottom mirror stack 32 is formed.

Figure 3B:
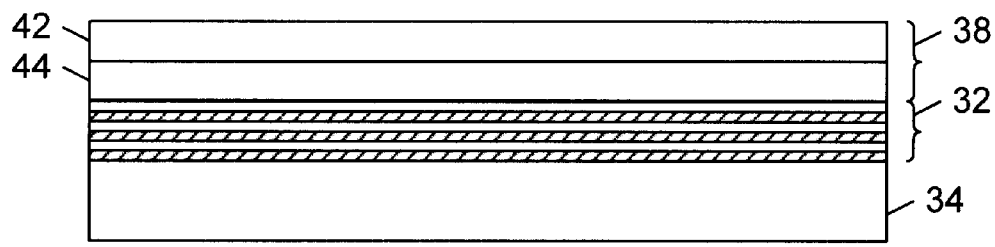
FIG. 3B is a diagrammatic cross-sectional side view of a cavity region formed over the bottom mirror of FIG. 3A.

As shown in FIG. 3B, a cavity region 38 is formed over bottom mirror stack 32 (step 40; FIG. 2). Cavity region 38 includes one or more active layers 42, 44 (e.g., a quantum well or one or more quantum dots). In some embodiments, active layers 42, 44 may be sandwiched between a pair of spacer layers (not shown). In other embodiments, active layers 42, 44 may be located above or below a single spacer layer. Active layers 42, 44 may be formed from AlInGaAs (i.e., AlInGaAs, GaAs, AlGaAs and InGaAs), InGaAsP (i.e., InGaAsP, GaAs, InGaAs, GaAsP, and GaP), GaAsSb (i.e., GaAsSb, GaAs, and GaSb), InGaAsN (i.e., InGaAsN, GaAs, InGaAs, GaAsN, and GaN), or AlInGaAsP (i.e., AlInGaAsP, AlInGaAs, AlGaAs, InGaAs, InGaAsP, GaAs, InGaAs, GaAsP, and GaP). Other quantum well layer compositions also may be used. The first and second spacer layers (if present) may be formed from materials chosen based upon the material composition of the active layers.

Figure 3C:
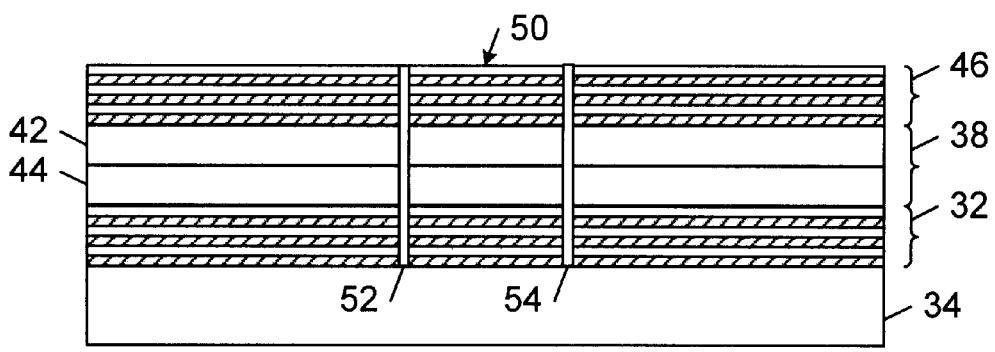
FIG. 3C is a diagrammatic cross-sectional side view of a top mirror formed over the cavity region of FIG. 3B and oxidation holes formed in the resulting vertical stack structure.

Referring to FIG. 3C, a top mirror stack 46 is formed over cavity region 38 (step 48; FIG. 2). Top mirror stack 46 preferably is formed from the same material system as bottom mirror stack 32. In the illustrated embodiment, bottom and top mirror stacks 32, 46 are cooperatively designed so that laser light 22 is emitted from a substantially planar top surface 50 of vertical stack structure 14 and through optically transparent substrate 12 (see FIG. 1).

The layers of vertical stack structure 14 may be formed by conventional epitaxial growth processes, such as metal-organic chemical vapor deposition (MOCVD) and molecular beam epitaxy (MBE). As shown, in the illustrated embodiment, vertical stack structure 14 has a planar structure that includes a number of holes 52, 54 that expose a number of respective side regions of the bottom and top mirror stacks 32, 46 to be oxidized. At least a portion of each of bottom mirror stack 32 and top mirror stack 46 is oxidized from the exposed side regions inwardly toward a centrally located aperture region 56. In this embodiment, four holes (two of which are not shown in the drawings) are opened at locations that are equidistant from the center of aperture region 56. The holes 52, 54 extend from a bottom surface of bottom mirror stack 32 to the layer (or layers) corresponding to the portion of vertical stack structure 14 to be oxidized. When the vertical stack structure 14 is exposed to heated water vapor, the heated water vapor enters the holes and oxidizes one or more layers of vertical stack structure 14 in a radial direction away from the holes. The oxidation process continues until an oxidation front from each hole merges to form the un-oxidized aperture region 56. Other vertical stack structure embodiments may include more or fewer exposure holes or exposed regions with other shapes, such as divided arcs or rings.

Figure 3D:
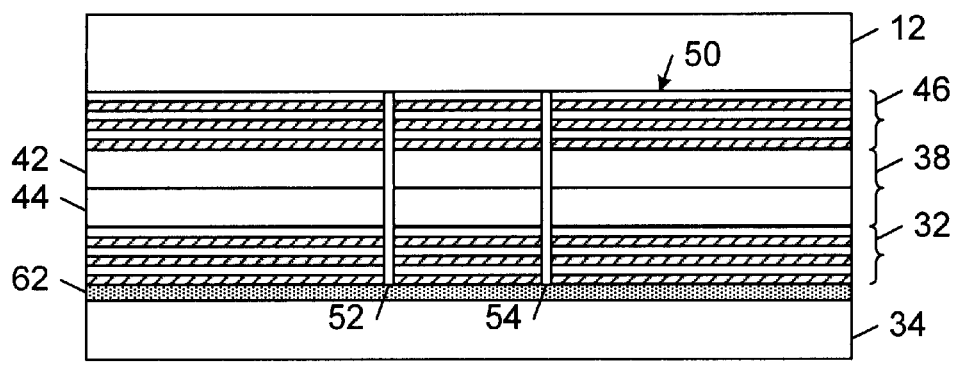
FIG. 3D is a diagrammatic cross-sectional side view of an optically transparent substrate wafer bonded to the top mirror of FIG. 3C.

As shown in FIG. 3D, optically transparent substrate 12 is wafer bonded to the substantially planar top surface 50 of vertical stack structure 14 (step 58; FIG. 2). The optically transparent substrate 12 preferably is substantially transparent to light in a selected wavelength range. In general, the selected wavelength range encompasses the wavelength of light generated by vertical stack structure 14. For example, in some embodiments the optically transparent substrate 12 is substantially transparent to light having a wavelength in the range of 650 nm to 1650 nm. In some embodiments, optically transparent substrate 12 is formed from glass (e.g., borosilicate glass). The use of borosilicate glass in gallium arsenide based embodiments is particularly advantageous because the thermal expansion properties of borosilicate glass and gallium arsenide are closely matched. Borosilicate glass also is advantageous because it allows low temperature processing and is transparent to visible and near-IR wavelengths of light. In other embodiments, optically transparent substrate 12 is formed from gallium phosphide. In other embodiments, optically transparent substrate 12 may be formed from other materials. In general, optically transparent substrate 12 may be attached to surface 50 by a conventional direct wafer bonding process or a conventional metallic bonding process that is tailored to the selected material systems of optically transparent substrate 12 and vertical stack structure 14.

Figure 3E:
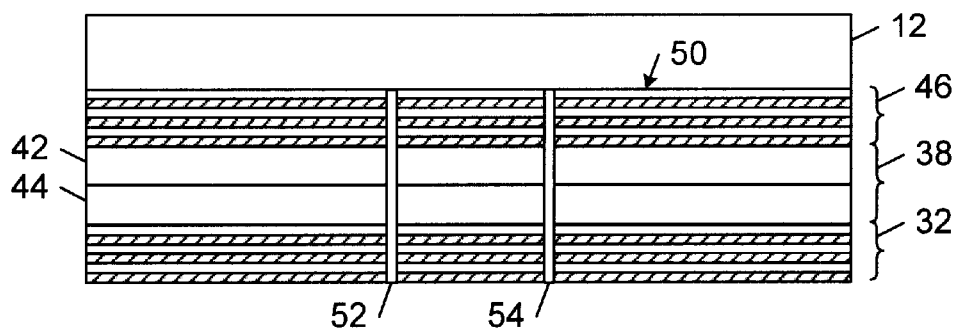
FIG. 3E is a diagrammatic cross-sectional side view of the vertical cavity surface emitting laser system of FIG. 3D after the sacrificial substrate has been removed.

As shown in FIG. 3E, after the optically transparent substrate 12 has been wafer bonding to vertical stack structure 14 (step 58; FIG. 2), sacrificial substrate 34 is removed (step 60; FIG. 2). In general, sacrificial substrate 34 may be removed by any one of a wide variety of conventional substrate removal processes. For example, in one embodiment, sacrificial substrate 34 may be removed by a selective wet chemical etching process. In this embodiment, an etch stop layer 62 (see FIG. 3D) preferably is formed between the sacrificial substrate 34 and bottom mirror stack 32. In another embodiment, sacrificial substrate 34 may be removed by laser melting. In some embodiments, etch stop layer 62 also may be removed.

Figure 3F:
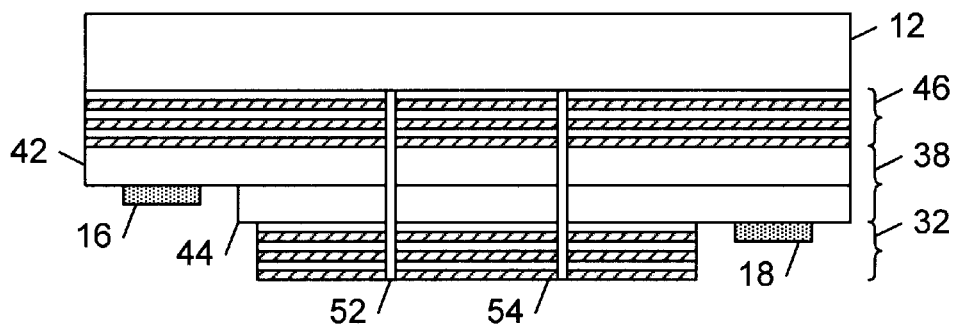
FIG. 3F is a diagrammatic cross-sectional side view of the vertical cavity surface emitting laser system of FIG. 3E after the bottom surface has been patterned and a pair of contacts has been formed over a bottom side of the vertical stack structure.

Referring to FIG. 3F, after sacrificial substrate 34 has been removed (step 60; FIG. 2), vertical stack structure is patterned and etched, and contacts 16, 18 are formed over the bottom side of the patterned vertical stack structure (step 64; FIG. 2). The vertical stack structure may be formed by a conventional photolithographic patterning and etching process.

Referring back to FIG. 1, in the illustrated embodiment, lens 24 is formed on the opposite surface of optically transparent substrate 12 as the vertical stack structure 14. Lens 24 (and the corresponding lens 26 of package window 28) may be a replicated epoxy lens or a diffractive optical element (DOE).

In the illustrated embodiment, contacts 16, 18 may be bonded to corresponding contacts of a suitable driving circuit disposed on driver substrate 20 using a flip-chip solder bonding process. In this embodiment, solder bumps 66, 68 are disposed between contacts 16, 18 and the corresponding metallization pattern of the driving circuit. The Z-axis dimensions 4, of solder bumps 66, 68 are selected to separate the bottom side of vertical stack structure 14 from the driving circuit by an appropriate distance. During manufacture, solder bumps 66, 68 originally may be disposed on the metallization pattern of the driving circuit. Vertical cavity surface emitting laser system 10 is aligned with the driving circuit to within an accuracy required for solder bumps 66, 68 to contact the corresponding driving circuit metallization pattern. The assembly then is raised to a temperature at or above the melting point of solder bumps 66, 68. Solder bumps 66, 68 wet the solderable contacts 16, 18 and surface tension forces pull vertical cavity surface emitting laser system 10 and driver substrate 20 into very precise alignment (e.g., to within ±4 μm). The assembly is cooled to form a solidly bonded, accurately aligned structure.

Electrical contacts 16, 18 enable vertical cavity surface emitting laser system 10 to be driven by the driving circuit that is disposed on driver substrate 20. In operation, an operating voltage is applied across electrical contacts 16, 18 to produce a current flow in vertical stack structure 14. In general, current flows through a central region of the vertical stack structure 14 and lasing occurs in a central portion of cavity region 38 (hereinafter the "active region"). The oxidized portions of bottom and top mirror stacks 32, 36 form an oxide confinement region that laterally confines carriers and photons. Carrier confinement results from the relatively high electrical resistivity of the confinement region, which causes electrical current preferentially to flow through a centrally located region of vertical stack structure 14. Optical confinement results from a substantial reduction of the refractive index of the confinement region that creates a lateral refractive index profile that guides the photons that are generated in cavity region 38. The carrier and optical lateral confinement increases the density of carriers and photons within the active region and, consequently, increases the efficiency with which light is generated within the active region.

Other embodiments are within the scope of the claims.

What is claimed is:

1. A vertical cavity surface emitting laser (VCSEL) system, comprising:
   a substrate optically transparent to light in a selected wavelength range;
   a vertical stack structure having a substantially planar top side wafer bonded to the optically transparent substrate and a bottom side, and including
   a top mirror,
   a bottom mirror, and
   a cavity region disposed between the top mirror and the bottom mirror and including an active light generation region operable to generate light in the selected wavelength range,
   wherein the vertical stack structure is constructed and arranged to direct light generated in the cavity region to the optically transparent substrate; and
   first and second contacts disposed over the bottom side of the vertical stack structure and electrically connected for driving the cavity region.

2. The VCSEL system of claim 1, wherein the optically transparent substrate comprises glass.

3. The VCSEL system of claim 2, wherein the optically transparent substrate comprises borosilicate glass.

4. The VCSEL system of claim 1, wherein the optically transparent substrate comprises gallium phosphide.

5. The VCSEL system of claim 1, further comprising a lens disposed on the substrate in alignment with the active light generation region.

6. The VCSEL system of claim 1, wherein at least one of the top mirror and the bottom mirror has a layer with a peripheral region oxidized into an electrical insulator as a result of exposure to an oxidizing agent.

7. The VCSEL system of claim 6, further comprising two or more etched holes each extending from a substantially planar surface of the bottom mirror to the oxidized peripheral region.

8. The VCSEL system of claim 1, wherein the top mirror and the bottom mirror each comprises a system of alternating layers of different refractive index materials.

9. The VCSEL system of claim 8, wherein the top mirror and the bottom mirror each comprises a system of alternating layers of relatively high aluminum content AlGaAs and relatively low aluminum content AlGaAs.

10. The VCSEL system of claim 1, further comprising an integrated circuit bonded to the pair of contacts and operable to drive the cavity region.

11. A method of fabricating a vertical cavity surface emitting laser (VCSEL) system, comprising:

providing a sacrificial substrate;

forming over the sacrificial substrate a vertical stack structure having a substantially planar top side and a bottom side, and including
a top mirror,
a bottom mirror, and
a cavity region disposed between the top mirror and the bottom mirror and including an active light generation region operable to generate light in a selected wavelength range,
wherein the vertical stack structure is constructed and arranged to direct light generated in the cavity region away from the sacrificial substrate; and wafer bonding the substantially planar top side of the vertical stack structure to a substrate optically transparent to light in the selected wavelength range;

removing the sacrificial substrate after the optically transparent substrate has been wafer bonded to the substantially planar top side of the vertical stack structure; and forming over the bottom side of the vertical stack structure first and second contacts electrically connected for driving the cavity region.

12. The method of claim 11, wherein the optically transparent substrate comprises glass.

13. The method of claim 12, wherein the optically transparent substrate comprises borosilicate glass.

14. The method of claim 11, wherein the optically transparent substrate comprises gallium phosphide.

15. The method of claim 11, further comprising forming a lens on the glass substrate in alignment with the active light generation region.

16. The method of claim 11, wherein at least one of the top mirror and the bottom mirror has a layer with a peripheral region oxidized into an electrical insulator as a result of exposure to an oxidizing agent.

17. The method of claim 16, further comprising forming two or more etched holes each extending from a substantially planar surface of the bottom mirror to the oxidized peripheral region.

18. The method of claim 11, wherein the top mirror and the bottom mirror each comprises a system of alternating layers of different refractive index materials.

19. The method of claim 18, wherein the top mirror and the bottom mirror each comprises a system of alternating layers of relatively high aluminum content AlGaAs and relatively low aluminum content AlGaAs.

20. The method of claim 11, further comprising bonding to the pair of contacts an integrated circuit operable to drive the cavity region.

21. The VCSEL system of claim 1, wherein the first and second contacts are respectively disposed on surfaces of different active layers each extending to the light generation region of the cavity region.

22. The method of claim 11, wherein the first and second contacts are respectively formed on surfaces of different active layers each extending to the light generation region of the cavity region.

* * * * *